United States Patent
Kim et al.

(10) Patent No.: US 10,116,331 B2
(45) Date of Patent: Oct. 30, 2018

(54) DATA TRANSMITTING AND RECEIVING APPARATUS HAVING IMPROVED LOW-DENSITY PARITY-CHECK (LDPC) ENCODING, DECODING AND TRANSMISSION RATE

(71) Applicant: Electronics and Telecommunications Research Institute, Daejeon (KR)

(72) Inventors: Pan Soo Kim, Daejeon (KR); Deock Gil Oh, Daejeon (KR); Xavier Giraud, Versailles (FR)

(73) Assignee: Electronics and Telecommunications Research Institute, Daejeon (KR)

( * ) Notice: Subject to any disclaimer, the term of this patent is extended or adjusted under 35 U.S.C. 154(b) by 60 days.

(21) Appl. No.: 15/067,388

(22) Filed: Mar. 11, 2016

(65) Prior Publication Data

US 2016/0269049 A1    Sep. 15, 2016

(30) Foreign Application Priority Data

Mar. 12, 2015  (KR) .................. 10-2015-0034483

(51) Int. Cl.
*H03M 13/11*    (2006.01)
*H04L 1/00*    (2006.01)
(Continued)

(52) U.S. Cl.
CPC .... *H03M 13/1102* (2013.01); *H03M 13/1165* (2013.01); *H03M 13/255* (2013.01); *H03M 13/27* (2013.01); *H04L 1/005* (2013.01); *H04L 1/0042* (2013.01); *H04L 1/0057* (2013.01); *H04L 25/03* (2013.01)

(58) Field of Classification Search
CPC .......... H03M 13/1102; H03M 13/255; H03M 13/27; H03M 13/1165; H04L 25/03; H04L 1/005; H04L 1/0057; H04L 1/0042
See application file for complete search history.

(56) References Cited

U.S. PATENT DOCUMENTS 7,555,696 B2 * 6/2009 Schmidt .............. H03M 13/255
                                                    714/758
8,006,163 B2 * 8/2011 Djordjevic ......... H03M 13/1102
                                                    375/341

(Continued)

OTHER PUBLICATIONS

"Faster-Than-Nyquist Signaling" by John B. Anderson 2013 IEEE 101, No. 8, Aug. 2013 | Proceedings of the IEEE.*
(Continued)

*Primary Examiner* — Cynthia Britt
(74) *Attorney, Agent, or Firm* — William Park & Associates Ltd.

(57) ABSTRACT

Provided is a data transmitting and receiving apparatus that may process a signal to be transmitted using a faster-than-Nyquist (FTN) method. The data transmitting and receiving apparatus may perform low-density parity-check (LDPC) encoding on data to be transmitted using a first matrix having a first degree based on a preset reference and a second matrix having a single diagonal matrix structure, independently perform interleaving and symbol mapping on each of an information bit and a parity bit of the data, accelerate an output signal by a transmission rate based on the FTN method, and transmit the data.

12 Claims, 13 Drawing Sheets

(51) Int. Cl.
*H03M 13/25* (2006.01)
*H03M 13/27* (2006.01)
*H04L 25/03* (2006.01)

(56) References Cited

U.S. PATENT DOCUMENTS

| | | | | |
|---|---|---|---|---|
| 8,879,670 B2* | 11/2014 | Gentile | ............. | H03M 13/1111 |
| | | | | 375/340 |
| 9,634,870 B2* | 4/2017 | Beidas | ............. | H04L 25/03318 |
| 2006/0085727 A1* | 4/2006 | Azenkot | ................... | H04L 5/02 |
| | | | | 714/792 |
| 2008/0028271 A1* | 1/2008 | Chen | .................. | H03M 13/033 |
| | | | | 714/752 |
| 2011/0167321 A1 | 7/2011 | Hwang et al. | | |
| 2011/0188550 A1 | 8/2011 | Wajcer et al. | | |
| 2014/0040909 A1 | 2/2014 | Winser et al. | | |
| 2014/0089766 A1 | 3/2014 | Etri | | |
| 2014/0226752 A1* | 8/2014 | Kim | ..................... | H04L 1/0042 |
| | | | | 375/296 |
| 2015/0010118 A1* | 1/2015 | Beidas | ............. | H04L 25/03006 |
| | | | | 375/341 |
| 2015/0237407 A1* | 8/2015 | Lee | ..................... | H04L 1/0071 |
| | | | | 725/68 |
| 2015/0381392 A1* | 12/2015 | Beidas | ............. | H04L 25/03286 |
| | | | | 375/308 |
| 2016/0269049 A1* | 9/2016 | Kim | ..................... | H04L 1/0057 |

OTHER PUBLICATIONS

N. S. Loghin, M. Kan and J. Zollner, "Incremental Redundancy for LDPC Codes of 2nd Generation DVB Systems," 2012 IEEE 75th Vehicular Technology Conference (VTC Spring), Yokohama, 2012, pp. 1-5.*
N. Nangare, K. R. Narayanan, Xueshi Yang and E. Kurtas, "Joint timing recovery, ISI equalization and decoding using per-survivor BCJR-DFE," GLOBECOM '05. IEEE Global Telecommunications Conference, 2005., 2005, pp. 5 pp.*
Alan Barbieri, et al., "Time-Frequency Packing for Linear Modulations: Spectral Efficiency and Practical Detection Schemes," IEEE Transactions on Communications, Oct. 2009, pp. 2951-2959, vol. 57, No. 10, IEEE.
Pansoo Kim, et al., "Synchronization for Faster Than Nyquist Signalling Transmission," ICUFN 2015, Jul. 7-10, 2015, pp. 944-949, IEEE.
"Call for Papers," The Seventh International Conference on Ubiquitous and Future Networks, Jul. 7-10, 2015, Sapporo, Japan, IEEE Communications Society.

* cited by examiner

DATA TRANSMITTING AND RECEIVING APPARATUS HAVING IMPROVED LOW-DENSITY PARITY-CHECK (LDPC) ENCODING, DECODING AND TRANSMISSION RATE

CROSS-REFERENCE TO RELATED APPLICATION

This application claims the priority benefit of Korean Patent Application No. 10-2015-0034483 filed on Mar. 12, 2015, in the Korean Intellectual Property Office, the disclosure of which is incorporated herein by reference.

BACKGROUND

1. Field of the Invention

Embodiments relate to a data transmitting and receiving apparatus, and more particularly, to an apparatus for transmitting and receiving data by improving low-density parity-check (LDPC) encoding and decoding and a transmission rate.

2. Description of the Related Art

According to the Shannon-Hartley theorem, a digital transmission system may have a theoretical limitation in a transmission capacity in one-to-one communication or one-to-multi communication. In data transmission and reception, a transmission rate for transmitting and receiving a signal to prevent occurrence of an inter-symbol interference (ISI) is referred to as a Nyquist rate. However, an ISI may inevitably occur when transmitting and receiving data at a rate higher than the Nyquist rate.

Recently, a demand for transmission of high-capacity data such as an ultra-high-definition television (UHDTV) service, for example, satellite broadcasting, and a high-definition image is rapidly increasing. Thus, there is a desire for a method of transmitting and receiving data using a less frequency band for a less period of time compared to an existing method of transmitting and receiving data based on a transmission efficiency.

SUMMARY

According to an aspect, there is provided a data transmitting apparatus including a low-density parity-check (LDPC) encoder configured to perform, on data to be transmitted, LDPC encoding using a first matrix having a first degree lower than a preset reference and a second matrix of a single diagonal matrix, a symbol mapper configured to perform symbol mapping on information bits and parity bits of the data, independently, by performing interleaving on the information bits and the parity bits using different interleavers and applying differential encoding to a codeword of the parity bits, and an accelerator configured to accelerate an output signal by a transmission rate based on a faster-than-Nyquist (FTN) method. The first degree of the first matrix may be one of 1, 2, and 3, and a degree of the second matrix may be 1.

The symbol mapper may perform the interleaving on the information bits through a first interleaver, and perform the interleaving on the parity bits through a second interleaver having a different degree from the first interleaver. The first interleaver may be set to be less than or equal to a length of the data, and the second interleaver may be set to be greater than or equal to a difference between the length of the data and a length of the LDPC encoded data. The differential encoding may be applied to the codeword using the second interleaver. Each of the first interleaver and the second interleaver may be based upon a prime number. The symbol mapper may perform first symbol mapping on the information bits, and perform second symbol mapping on the parity bits independently from the first symbol mapping. The second symbol mapping may be symbol mapping iteratively performed on the parity bits based on real-axis data and imaginary-axis data.

According to another aspect, there is provided a data receiving apparatus including a synchronizer configured to perform carrier synchronization by receiving a signal obtained by performing LDPC encoding using a first matrix having a first degree lower than a preset reference and a second matrix of a single diagonal matrix, wherein the signal may be generated by interleaving information bits and parity bits through two different interleavers and applying differential encoding on a codeword of the parity bits, a detector configured to detect an original signal by applying a first Bahl, Cocke, Jelinek, and Raviv (BCJR) algorithm to the information bits and applying a second BCJR algorithm including differential decoding to the parity bits, compensate for a phase error of the original signal by tracing back a signal from a forward recursor included in the first BCJR algorithm and the second BCJR algorithm, and eliminate an inter-symbol interference (ISI) using an FTN method applied to the received signal, and an LDPC decoder configured to perform LDPC decoding corresponding to the LDPC encoding applied to the received signal using two deinterleavers having different degrees.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
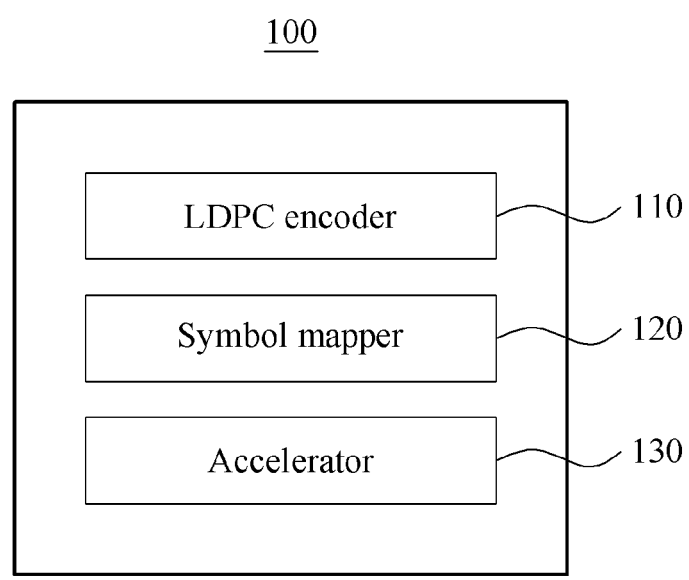
FIG. 1 is a block diagram illustrating a data transmitting apparatus according to an embodiment.

Reference will now be made in detail to embodiments of the present disclosure, examples of which are illustrated in the accompanying drawings, wherein like reference numerals refer to the like elements throughout. Here, the examples are not construed as being intended to limit the present disclosure and should be understood to include all changes, equivalents, and replacements within the idea and the technical scope of the present disclosure.

Unless otherwise defined, all terms including technical and scientific terms used herein have the same meaning as currently and widely used and also commonly understood by one of ordinary skill in the art to which these embodiments belong. It will be further understood that the terms used herein may vary depending on an intention of one of ordinary skill in the art, a convention, or the development of technology or the advent of new technology.

In addition, some terms used herein are selected by an applicant(s) to assist the reader in gaining an understanding about the embodiments and/or provide convenience for description. In such a case, detailed meanings of the terms will be described in Detailed Description. Thus, the terms used herein should be interpreted as having a meaning that is consistent with their meaning in the context of the present disclosure and will not be interpreted as having a meaning simply indicated by the terms per se.

A data transmitter based on a digital video broadcasting-satellite-second generation (DVB-S2) standard may include an input stream interface, a merger and slice configurer, a baseband header inserter, a stream adaptation unit, a forward error correction (FEC) code, a Bose, Chaudhuri, and Hocquenghem (BCH) code, a low-density parity-check (LDPC) encoder, a modulator and physical layer (PL) frame configurer, a PL header inserter, a PL scrambler, a baseband filter, and an orthogonal modulator. Although not defined as the standard, the DVB-S2 based data transmitter may further include a pre-distorter that may ease a memory component of a satellite transponder and a nonlinear distortion. When transmitting data at a transmission rate faster than a Nyquist rate using a square root raised cosine filter in a pulse shaper of the data transmitter, a transmission efficiency or a transmission rate per bandwidth may increase. That is, although an inter-symbol interference (ISI) may occur, an amount of data to be transmitted per bandwidth may effectively increase.

Equation 1 below represents, as a spectrum efficiency η, a relationship between a reduction in an occupied bandwidth of a signal and an improvement in a transmission efficiency per bandwidth.

$$\eta = \frac{r \cdot \log_2 M \cdot R_s}{B \cdot \tau}$$

[Equation 1]

In Equation 1, "$R_s$" and "r" denote a symbol rate and a coding rate of a channel code, respectively. "M" denotes a modulation degree (or a modulation order), for example, quadrature phase-shifting keying (QPSK)=4 and phase-shifting keying (PSK)=8. "B" denotes an occupied bandwidth of a signal. To reduce the occupied bandwidth, a method of reducing a roll-off may be used. In a case of defining the symbol rate as "1+roll-off," the spectrum efficiency η may increase as a value of the roll-off decreases. In a case of a single-carrier, for example, when a repeater filter is not sharp, the occupied bandwidth may be unrestrictedly controlled based on a value of the roll-off. However, in a case of a carrier present in a neighboring channel, definition of a bandwidth may be slightly complicated because a bandwidth may be optimized based on a carrier-to-interface (C/I) ratio with the neighboring channel.

A greater amount of data may be transmitted per bandwidth by increasing the symbol rate and setting a transmission rate to be higher than the Nyquist rate. However, due to an ISI that may inevitably occur, signal restoration may not be possible only through a matched filter that performs one sampling per symbol, and thus an additional method may be needed to eliminate such an interference.

FIG. 1 is a block diagram illustrating a data transmitting apparatus 100 according to an embodiment. Referring to FIG. 1, the data transmitting apparatus 100 includes an LDPC encoder 110, a symbol mapper 120, and an accelerator 130. The data transmitting apparatus 100 may transmit a signal based on a faster-than-Nyquist (FTN) method, and a transmission rate may be determined by the accelerator 130 based on a tau value of Equation 1. In a case of the Nyquist rate, the tau value is 1.

Figure 3:
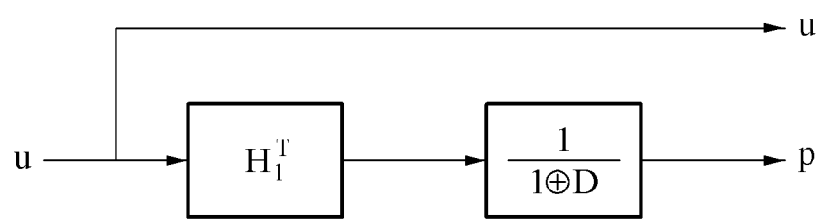
FIG. 3 is a diagram illustrating a structure of an extended Irregular Repeat-Accumulate (eIRA) based low-density parity-check (LDPC) encoder based on a DVB-S2 standard according to an embodiment.

The LDPC encoder 110 may perform LDPC encoding in a form modified from an existing DVB-S2 LDPC parity-check matrix and an extended irregular repeat accumulator (eIRA) structure. In detail, the LDPC encoder 110 may design a base parity-check matrix to avoid an LDPC variable (or bit) node connected to a same check node during channel memory length, and may generate a parity-check matrix by lifting the base parity-check matrix using an edge swapping algorithm (ESA). Through such a process, $H_1$ may be generated as illustrated in FIG. 3. As illustrated in FIG. 3, an eIRA based LDPC encoder such as a DVB-S2 type may generate a parity bit p through the LDPC encoding performed on an information bit u. According to an embodiment, a matrix $H_1^T$ may be applied to the information bit u by the symbol mapper 120. In detail, the symbol mapper 120 may generate the parity bit p through $uH_1^T$ by performing second interleaving, differential encoding, and applying the matrix $H_1^T$ to the information bit u. "T" herein stands for transpose. Such an aforementioned process may correspond to performing encoding using a single diagonal matrix having a degree of 1, and may also be expressed as an extended irregular repeat (eIR) process.

The symbol mapper 120 may perform symbol mapping on an input signal encoded by the LDPC encoder 110 using two interleavers that are independent from each other. In detail, interleaving may be performed on each of information bits and parity bits of data to be transmitted, using different interleavers for each of the information bits and the parity bits. For example, a first interleaver and a second interleaver having a different degree from the first interleaver may be used. After differential encoding is applied to a codeword of the parity bits, the symbol mapping may be performed independently on the information bits and the parity bits.

The first interleaver and the second interleaver may be determined in association with a length of the input signal. For example, the first interleaver length may be set to be a value less than or equal to the length of the input information signal, and the second interleaver may be set to be a value greater than or equal to a difference between the length of the input information signal and a length of the encoded input signal. Thus, the degree of the first interleaver and the degree of the second interleaver may differ from each other, and the two interleavers may operate independently from each other.

The differential encoding may be applied to the codeword using the second interleaver, and each of the two interleavers may be based upon a prime number.

In more detail, the independent symbol mapping may include performing first symbol mapping on the information bits. Here, a general symbol mapping process may be applied as the first symbol mapping. In addition, the independent symbol mapping may include second symbol mapping. Here, the second symbol mapping includes performing symbol mapping iteratively on each of real-axis (i.e. In-phase axis) data and imaginary-axis (i.e. Quadrature-phase axis) data of the parity bits, independently from the first symbol mapping. The differential encoding applied through the second interleaver may facilitate differential decoding in a data receiving apparatus.

The accelerator 130 may accelerate an output signal by a transmission rate based on the FTN method. The FTN method refers to a method of transmitting data by setting a symbol rate to be faster (higher) than a Nyquist rate. An ISI may occur more frequently in proportion to the transmission rate, and thus the output signal may include an interference corresponding to the determined transmission rate.

The data transmitting apparatus 100 illustrated in FIG. 1 may be applicable to all digital communication devices. A detailed example of a DVB-S2 standard based data transmitter will be described with reference to FIG. 2. Hereinafter, example embodiments will be described in more detail with reference to FIGS. 1 and 2.

Figure 2:
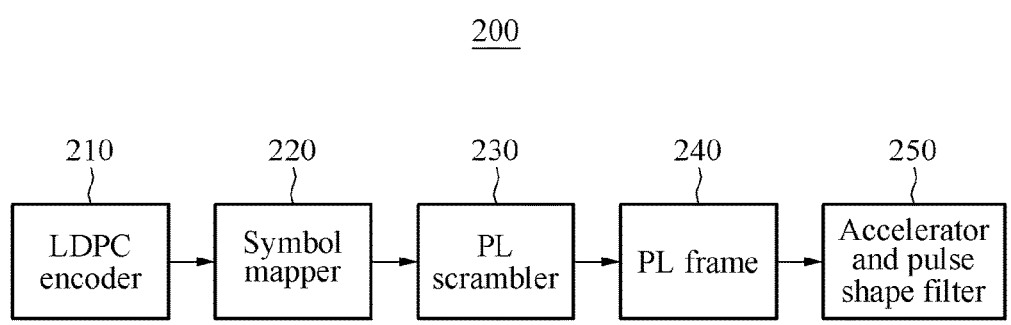
FIG. 2 is a diagram illustrating a data transmitting apparatus applied to a digital video broadcasting-satellite-second generation (DVB-S2) standard according to an embodiment.

FIG. 2 is a diagram illustrating a data transmitting apparatus 200 applied to a DVB-S2 standard according to an embodiment. Referring to FIG. 2, the data transmitting apparatus 200 includes an LDPC encoder 210 that is a detailed example of the LDPC encoder 110 of FIG. 1, a symbol mapper 220 that is a detailed example of the symbol mapper 120 of FIG. 1, a PL scrambler 230, a PL frame 240, and an accelerator and pulse shape filter 250. A detailed description of the data transmitting apparatus 200 of FIG. 2 will be provided with reference to FIG. 3.

FIG. 3 is a diagram illustrating a structure of an eIRA based LDPC encoder in accordance with a DVB-S2 standard according to an embodiment. The LDPC encoder 210 of FIG. 2 may be used as the LDPC encoder in FIG. 3 in accordance with the DVB-S2 standard. In FIG. 3, "u" indicates information data, and is expressed as a 1 xk vector, wherein "k" denotes a length of information bits. A codeword bit vector passing through an overall LDPC encoding process may be 1xn, wherein "n" denotes a length of codeword bits.

A matrix H in a form of (n−k) by n indicates a parity check matrix, and may be configured to be [A B], for example, H=[A B], wherein "A" has an irregularly repeating structure of (n−k) by k and "B" has an accumulator structure of (n−k) by (n−k). "A" is the first matrix, and "B" is the second matrix. In FIG. 3, A corresponds to a block of "$H_1^T$," and an accumulator structure $B^{-T}$ corresponds to a block of "1/1+ D." Here, "$T$" indicates transposing a matrix and "$-T$" indicates transposing an inverse matrix. In A, a sparse matrix having an element 1 in an address in Annex B and Annex C in the DVB-S2 standard corresponds to $H_1$, and B has a dual (degree 2) diagonal matrix structure having step-type elements.

In FIG. 2, the LDPC encoder 210 may configure the parity-check matrix to be [G I], for example, H=[G I], wherein "G" indicates (n−k) by k that has the same characteristic as A, "B" indicates a single (degree 1) diagonal matrix, and "I" indicates an unit matrix. A detailed illustration is provided with reference to FIG. 4. A has an LDPC code characteristic in a quasi-cyclic form in the DVB-S2 standard, and is generated generally using, for example, a PEG algorithm and an edge swapping algorithm Table 1 below indicates a degree distribution of a variable node of the matrix A. Referring to Table 1, when a degree D is 2, for example, when the number of 1 included in the matrix A is 2, many information bits are included. The degree distribution may differ from the DVB-S2 standard based LDPC encoding, which indicates that an LDPC variable node connected to a check node may be designed to avoid being present in a channel memory length. In Table 1, the unit is percentage (%). "D" herein stands for Degree.

TABLE 1

| LDPC rate | D = 2 | D = 3 | Other D |
|---|---|---|---|
| 3/5 | 88.9 | 0.9 | 10.1 (D = 15) |
| 2/3 | 91.7 | 0 | 8.3 (D = 14) |
| 3/4 | 83.7 | 8.9 | 7.4 (D = 19) |

That is, the LDPC encoder 210 may perform LDPC encoding on data to be transmitted, using a first matrix having a first degree less than a preset reference and a second matrix of a single diagonal matrix. Here, the preset reference may be defined as indicated in Table 1, and the first matrix degree may be 1, 2, or 3. Here, it may be desirable when the first degree is 1. In the matrix H including G and I, the first matrix having the first degree may correspond to G and the second matrix may correspond to I.

In addition, as shown in Table 1, the first degree may be defined to maintain a probability of being 2 and 3 to be at least 90%. The first matrix degree may also be greater than 3.

Figure 4:
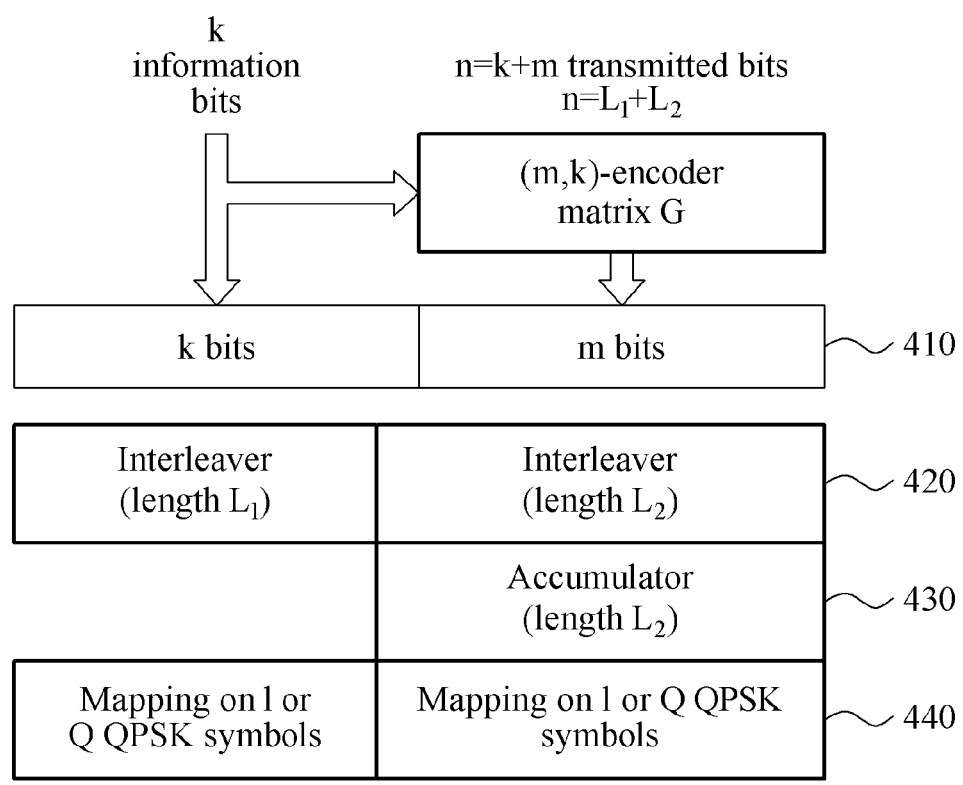
FIG. 4 is a diagram illustrating an LDPC encoding process, a bit interleaving process, and a transmission symbol mapping process of a data transmitting apparatus according to an embodiment.

FIG. 4 is a diagram illustrating an LDPC encoding process, a bits interleaving process, and a transmission symbol mapping process of a data transmitting apparatus according to an embodiment. FIG. 4 illustrates the LDPC encoding process and the transmission symbol mapping process in a case of QPSK. In FIG. 4, "k" indicates information bits and "n" indicates transmission bit data. Here, n may be codeword bits passing through the LDPC encoding process, and may be encoded by a matrix G to be derived by a parity-check matrix. A first interleaver with a length $L_1$ and a second interleaver with a length $L_2$ may operate independently from each other. Here, the length $L_1$ may be less than or equal to k, and the length $L_2$ may be determined to be greater than or equal to a value of (n−k=m). Thus, the length $L_2$ may include a portion of a parity bit part B and a portion of an information bit part A, wherein a degree of B is 1 and a degree of A is desirably 1. Here, when the degree of A is greater than 1, the degree of A may need to be approximate to 1, for example, 2 or 3. The first interleaver and the second interleaver used for the length $L_1$ and the length $L_2$ may vary, and various methods ensuring randomness may be applied to determine a value of the length $L_1$ and the length $L_2$.

For example, the length $L_1$ and the length $L_2$ may use random interleavers having a prime number. A relational expression of changing an address of an interleaver memory is shown in Equation 2 below.

New address value=[previous address value+(random prime number)]module [$L_1$ or $L_2$] [Equation 2]

After the interleaving process ($L_2$), a 1/1+D calculation may be performed by an accelerator of the accelerator and pulse shape filter 250.

In the symbol mapping process, to the $L_1$ part, an M-ary PSK signal such as existing QPSK and 8PSK, or a method used in the DVB-S2 standard such as 16 amplitude and phase-shift keying (APSK) and 32APSK may be applicable. However, in a case of the QPSK, in the symbol mapping in the $L_2$ part, symbol mapping for each of a In-phase (real) part and an Quadrature-phase (imaginary) part may be repeated twice on a In-phase (real) axis and twice on an Quadrature-phase (imaginary) axis to facilitate differential decoding and detection. A configuration of the PL scrambler 230 and the PL frame 240 may be identical to a known configuration in the DVB-S2 standard.

Referring to FIG. 2, the accelerator of the accelerator and pulse shape filter 250 may accelerate the output signal to be faster than the existing Nyquist rate, and thus an ISI may be included in a pulse shape filter of the accelerator and pulse shape filter 250.

The pulse shape filter of the accelerator and pulse shape filter 250 may determine a transmission rate of the output signal using an acceleration factor $\tau$. A value of $\tau$ is in a range of 0<$\tau$<1. Here, when the value of $\tau$ is 1, it is equal to the Nyquist rate. When the value of $\tau$ decreases, the transmission may be performed at a higher transmission rate than the Nyquist rate and an interference may increase.

Figure 5:
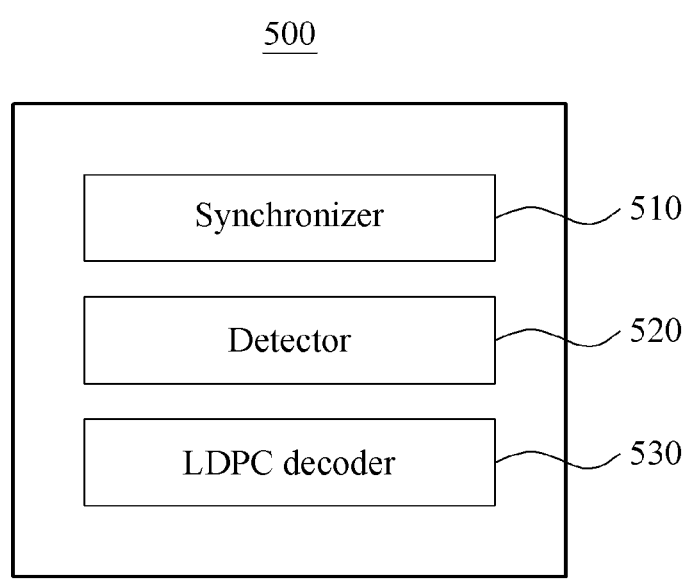
FIG. 5 is a block diagram illustrating a data receiving apparatus according to an embodiment.

FIG. 5 is a block diagram illustrating a data receiving apparatus 500 according to an embodiment. The data receiving apparatus 500 may receive a signal transmitted from the data transmitting apparatus 100 of FIG. 1 through an FTN method, and process data.

Referring to FIG. 5, the data receiving apparatus 500 includes a synchronizer 510, a detector 520, and an LDPC decoder 530. Hereinafter, each of the components will be described in detail.

The synchronizer 510 may perform carrier synchronization by receiving a signal obtained by performing LDPC encoding using a first matrix having a first degree lower than a preset reference and a second matrix of a single diagonal matrix. In detail, the synchronizer 510 may perform frame synchronization and control a signal level. The signal to be received may be generated by interleaving information bits and parity bits using two different interleavers, and applying differential encoding to a codeword of the parity bits. To restrict only a baseband signal with respect to the received signal, matched filtering may be performed and then the synchronizer 510 may eliminate a phase error and the like through the frame synchronization and control a signal level.

In more detail, the synchronizer 510 may include a frame synchronizer, a carrier synchronizer, and a signal level controller. The frame synchronizer may use a method of simultaneously detecting a frequency error and a starting point of a frame based on a twister correlator. The frame synchronizer may perform fine timing synchronization by discovering a correlation peak point in a time domain, estimating a frequency error by applying a faster Fourier transform (FFT) operation to the received data based on the correlation peak point in a frequency domain, and detecting a timing error based on an approximate maximum likelihood method. Here, the signal level controller may control a signal level when a timing error detector (TED) and a timing error controller (TEC) are in a steady state based on a pilot symbol. The signal level may be controlled using a robust signal-to-noise ratio (SNR) estimator.

The detector 520 may use an existing Bahl, Cocke, Jelinek, and Raviv (BCJR) detection algorithm (hereinafter referred to as a first BCJR detection algorithm) for a domain corresponding to an information part in the LDPC encoding process to detect an optimal signal in an ISI environment, and use a BCJR detection algorithm including differential decoding (hereinafter referred to as a second BCJR detection algorithm) for a domain corresponding to a parity part. In a process of calculating a maximum a posteriori (MAP) symbol probability in the second BCJR detection algorithm, a forward recursor and a backward recursor may be used to perform a branch metric operation. In a process of performing the branch metric operation in the forward recursor, synchronous detection may be performed by temporarily selecting a path in which the received signal and a signal to be transmitted are instantaneously determined to be stochastically most similar to each other and determining data, and correcting phase noise calculated based on a selected signal. That is, an original signal may be detected by applying the first BCJR detection algorithm to an information bit of the received signal and applying the second BCJR detection algorithm to a parity bit of the received signal, and a phase error of the original signal may be compensated for by tracing back the signal by the forward recursor.

The detector 520 may eliminate an ISI using the FTN method applied to the received signal. In detail, a sequence-based BCJR detection method may be applied to the ISI. The detector 520 may be subdivided into a trellis detector associated with the synchronous detection and an FTN detector to eliminate the ISI.

The LDPC decoder 530 may perform LDPC decoding corresponding to the LDPC encoding applied to the received signal using two deinterleavers having different degrees. The two different deinterleavers may be a first deinterleaver and a second deinterleaver. The first deinterleaver may be determined to correspond to the first interleaver used for the LDPC encoding applied to the received signal, and the second deinterleaver may be determined to correspond to the second interleaver used for the LDPC encoding applied to the received signal. That is, the LDPC decoding may be performed in a data receiver, for example, the data receiving apparatus 500, which corresponds to the LDPC encoding performed in a data transmitter, for example, the data transmitting apparatus 100. According to an embodiment, two independent interleavers may be used for encoding, and two independent deinterleavers corresponding to the two interleavers, respectively, may be used for decoding.

The data receiving apparatus 500 may be applicable to all digital communication devices that may transmit and receive data, and a detailed example of a configuration of such a data receiving apparatus will be described with reference to FIG. 6. The example is applied to a DVB-S2 standard reception modem.

Figure 6:
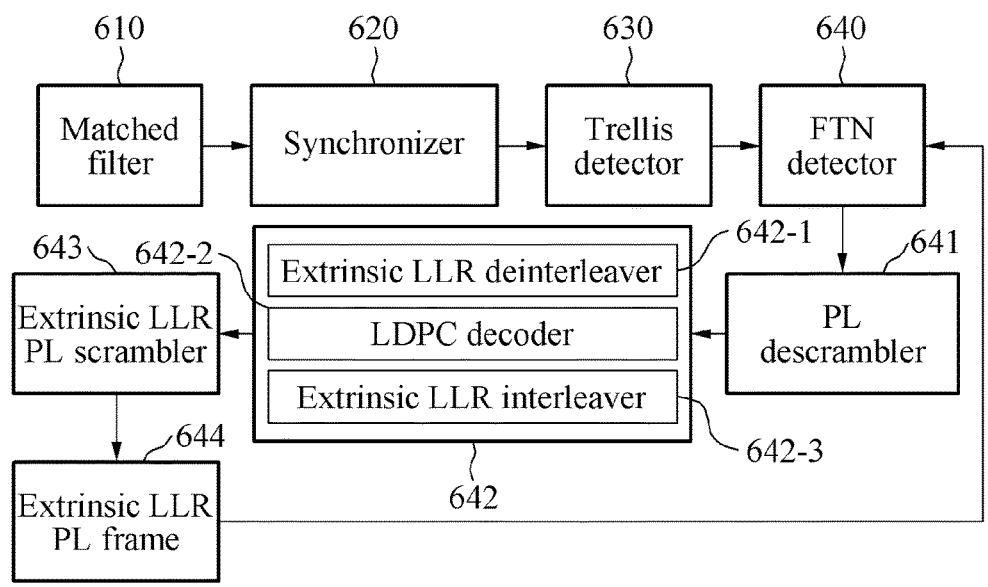
FIG. 6 is a diagram illustrating a data receiving apparatus applied to a DVB-S2 standard according to an embodiment.

FIG. 6 is a diagram illustrating a data receiving apparatus 600 applied to a DVB-S2 standard according to an embodiment. The data receiving apparatus 600 may receive a signal transmitted through an FTN method and restore an original signal.

Referring to FIG. 6, the data receiving apparatus 600 includes a matched filter 610, a synchronizer 620 that is a detailed example of the synchronizer 510 of FIG. 5, a trellis detector 630 and an FTN detector 640 hat are detailed examples of the detector 520 of FIG. 5, a PL descrambler 641, an LDPC decoder 642 that is a detailed example of the LDPC decoder 530 of FIG. 5, an extrinsic log-likelihood ratio (LLR) PL scrambler 643, and an extrinsic LLR PL frame 644.

The matched filter 610 may be used for limiting a band in a baseband despite presence of an ISI. Although an original signal may not be immediately restored even through the matched filter 610 due to the ISI, only a preset bandwidth may be used by limiting a band.

Figure 7:
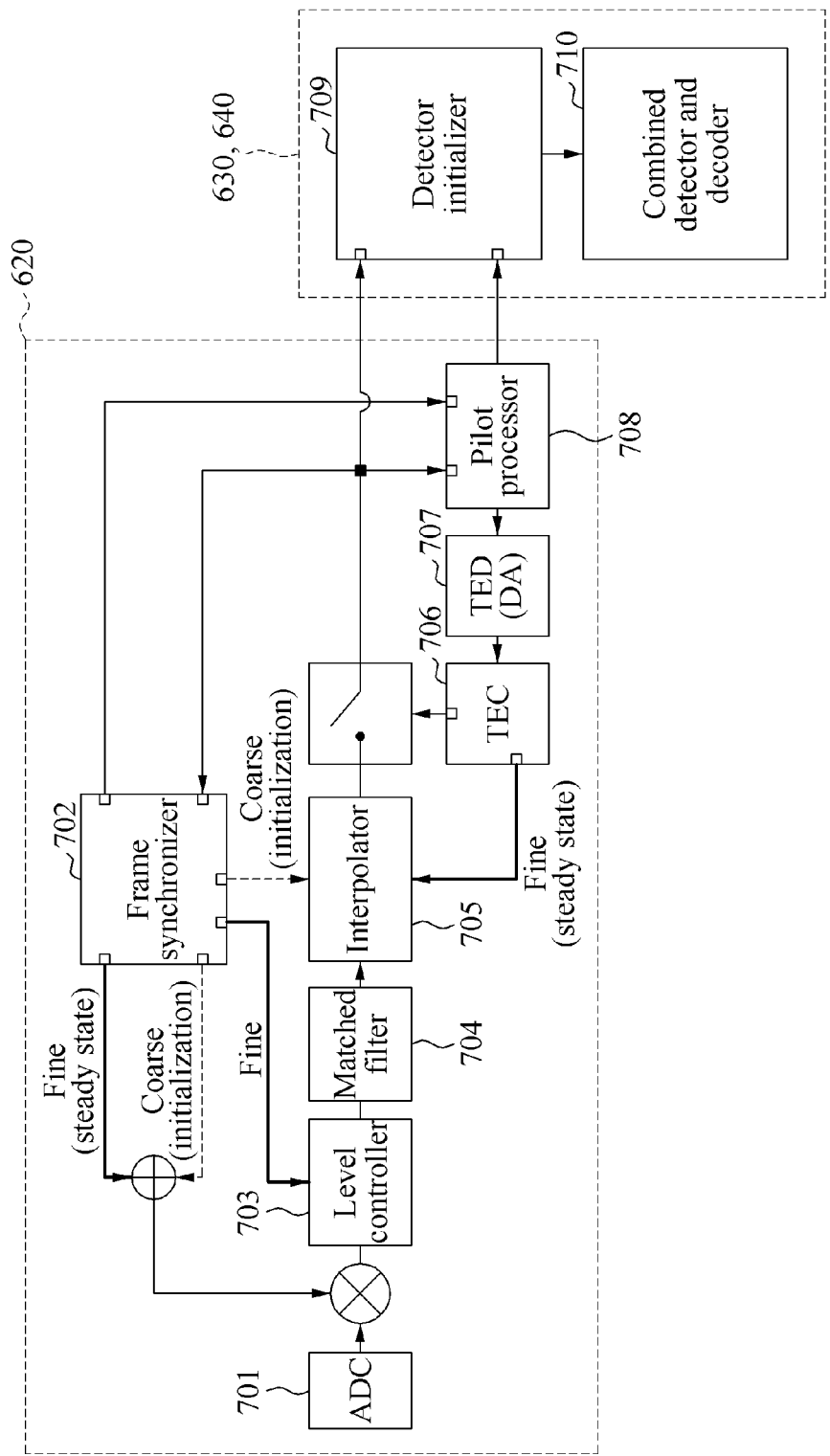
FIG. 7 is a diagram illustrating a detailed configuration of a synchronizer of FIG. 6.

FIG. 7 is a diagram illustrating a detailed structure of the synchronizer 620 f FIG. 6. The detailed structure of the synchronizer 620 may be illustrated as in FIG. 7. Referring to FIG. 7, the synchronizer 620 includes an analog-to-digital converter (ADC) 701, a frame synchronizer 702, a level controller 703, a matched filter 704, an interpolator 705, a TEC 706, a TED 707, and a pilot processor 708. In FIG. 7, the synchronizer 620 may be connected to a detector initializer 709 and a combined detector and decoder 710 including a trellis detector, an FTN detector, and an LDPC decoder, which are detailed examples of the two detectors, the trellis detector 630 and the FTN detector 640 of FIG. 6.

The ADC 701 may convert a received signal that is an analog signal to a digital signal. Since the signal is transmitted through an FTN method, sampling may need to be performed by a number of times greater than one sampling per symbol. For example, the ADC 701 may perform two oversampling per symbol. The frame synchronizer 702 may perform frame synchronization by immediately receiving the sampled signal. Here, controlling a signal level or interpolation may not be performed. In the frame synchronization, coarse timing recovery may be performed using PL header information. The coarse timing recovery may be a process in the coarse timing recovery, and various methods may be used. Alternatively, a twister correlator may be used to simultaneously detect a frequency error and a starting point of a frame. In detail, in a time domain, a correlation peak point may be discovered. In a frequency domain, a frequency error may be estimated based on the correlation peak point obtained through an FFT operation and the like, and the estimated frequency error may be corrected.

In an environment in which the frequency error is reduced, fine timing synchronization may be performed, and a frame of the signal may be detected based on an approximate maximum likelihood method. Dissimilar to a Gardner method used in a DVB-S2 based data receiver, such a process may operate based on a pilot symbol and interpolation may be applied after operations of the TED 707 and the TEC 706. Here, when such a process is performed in a steady state, the frame synchronizer 702 may perform fine frequency synchronization. Various methods may be used for the fine frequency synchronization, and each method may be applied.

Subsequent to such a process, the level controller 703 may control a signal level based on an SNR estimation method. Unlike in an existing ISI-free channel environment, the SNR estimation method may be used to control a signal level using a robust SNR estimator.

The SNR estimation method may be performed using a pilot symbol and known data such as a PL header. Subsequent to the controlling of the signal level, the signal may be transferred to the detector initializer 709 to perform two types of detection processes. The combined detector and decoder 710 including the trellis detector and the FTN detector may perform phase synchronization through BCJR detection and LDPC decoding in an environment in which an ISI is present.

Figure 8:
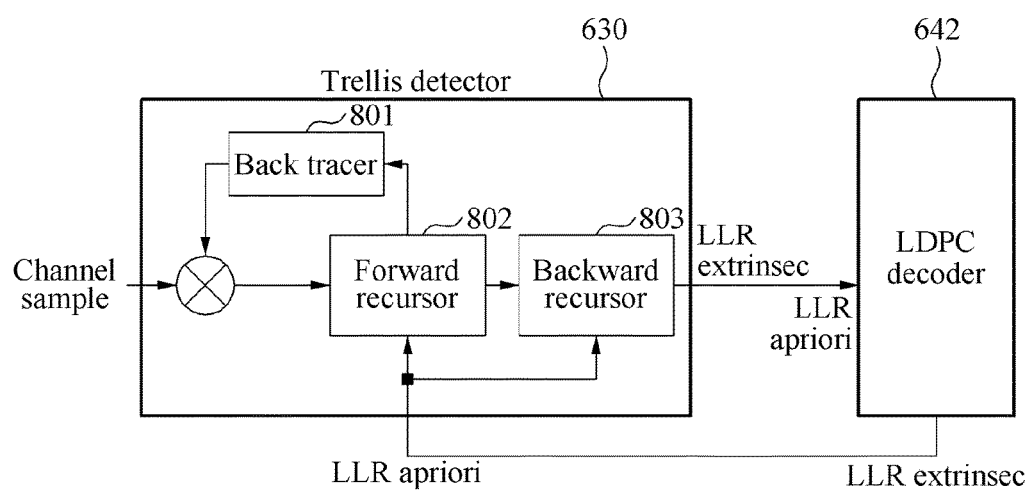
FIG. 8 is a diagram illustrating a synchronous compensation process for synchronous detection by a trellis detector according to an embodiment.

FIG. 8 is a diagram illustrating a synchronous detection process according to an embodiment. A process of phase synchronization and a process of easing phase noise may be performed based on a detection method with a reduced complexity. Referring to FIG. 8, a trellis detector 630 may operate based on a BCJR detection algorithm In detail, the trellis detector 630 includes a forward recursor 802 and a backward recursor 803. In a forward recursion process, a phase error value may be calculated based on a tentative data sequence obtained during a trellis section having a preset interval. Subsequently, through a phase-locked loop (PLL), an unnecessary phase error, for example, a residual frequency error, a phase error, and phase noise, may be eliminated. Relatively simply, when the forward recursor 802 transfers a signal back to a back tracer 801, the signal obtained through back tracing by the back tracer 801 may be used to calculate a phase error. The phase error may be simply compensated for using a complex multiplier through a loop filter and a numerically controlled oscillator (NCO). Also, in an $L_2$ part corresponding to a parity bit part, differential decoding may be performed to convert data in the $L_2$ part to data in a step type that is a parity check matrix having a degree of 2 to re-use an existing DVB-S2 LDPC decoder. As illustrated in FIG. 8, in a trellis detection process including BCJR symbol detection and LDPC decoding, an extrinsic information probability value obtained through the LDPC decoding may be updated to be a priori probability in the BCJR symbol detection. Thus, accuracy in the phase synchronization may be improved.

Referring back to FIG. 6, a signal output through the FTN detector 640 may be transferred to the LDPC decoder 642 through the PL descrambler 641. In detail, deinterleaving for an extrinsic probability soft bit in the extrinsic LLR deinterleaver 642-1, LDPC decoding in the LDPC decoder 642-2, and interleaving for an extrinsic probability soft bit in the extrinsic LLR interleaves 642-3 may be performed in sequence.

After the LDPC decoding is completed, PL scrambling of an extrinsic LLR may be performed in the extrinsic LLR PL scrambler 643. Subsequently, a PL frame value of the extrinsic LLR may be calculated in the extrinsic LLR PL frame 644, and transferred again to the FTN detector 640 as a priori symbol probability value. To the LDPC decoding in the LDPC decoder 642-2, a general LDPC decoding method may be applied. Here, a one-time loop from the FTN detector 640 returning to the FTN detector 640 may be referred to as a global iteration. Also, an iterative loop between a bit node decoder and a check node decoder in the LDPC decoding may be referred to as a local iteration.

Figure 9:
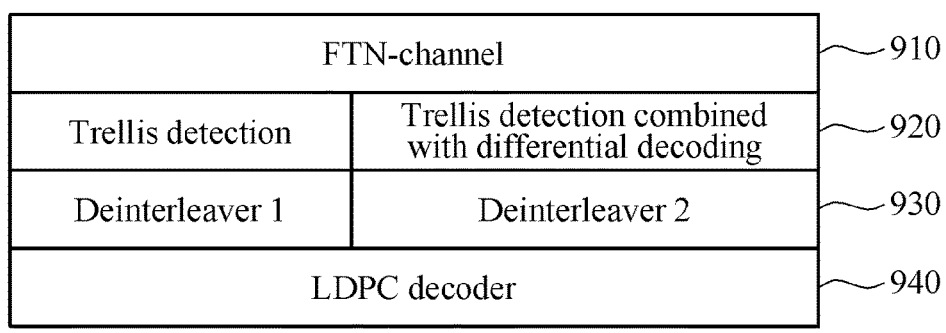
FIG. 9 is a diagram illustrating an LDPC decoding process for a signal transmitted through the processes of FIG. 4.

FIG. 9 is a diagram illustrating an LDPC decoding process to be performed on a signal transmitted through the processes described with reference to FIG. 4. In 920, corresponding to LDPC encoding performed using two different interleavers at a transmitting end, trellis detection may be performed on a part corresponding to an information part of a signal transmitted through an FTN method in 910, and trellis detection and differential decoding may be performed on a part corresponding to a parity part of the transmitted signal. In 930, deinterleaving may be performed using two different deinterleavers. In 940, LDPC decoding may be applied respectively. As described in the foregoing, the deinterleavers may be associated with interleaver values used in the LDPC encoding applied to the received signal.

Figure 10:
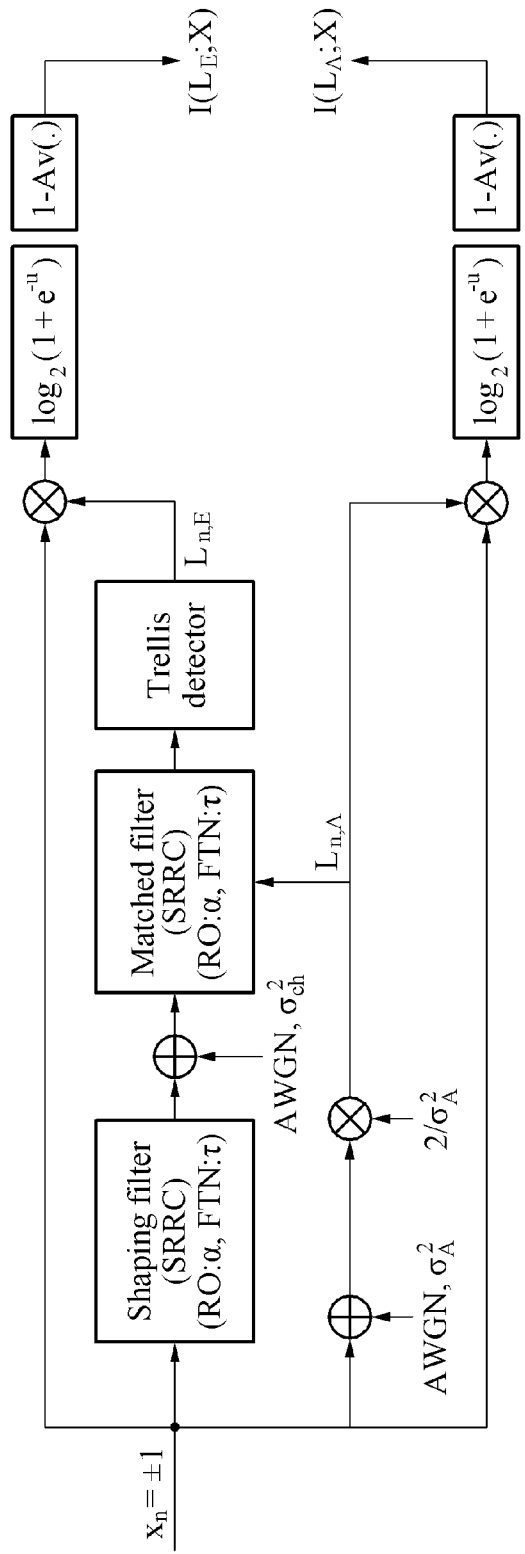
FIG. 10 is a diagram illustrating a structure for measuring transmission information, for example, mutual information, for a faster-than-Nyquist (FTN) signaling channel environment according to an embodiment.
Figure 11:
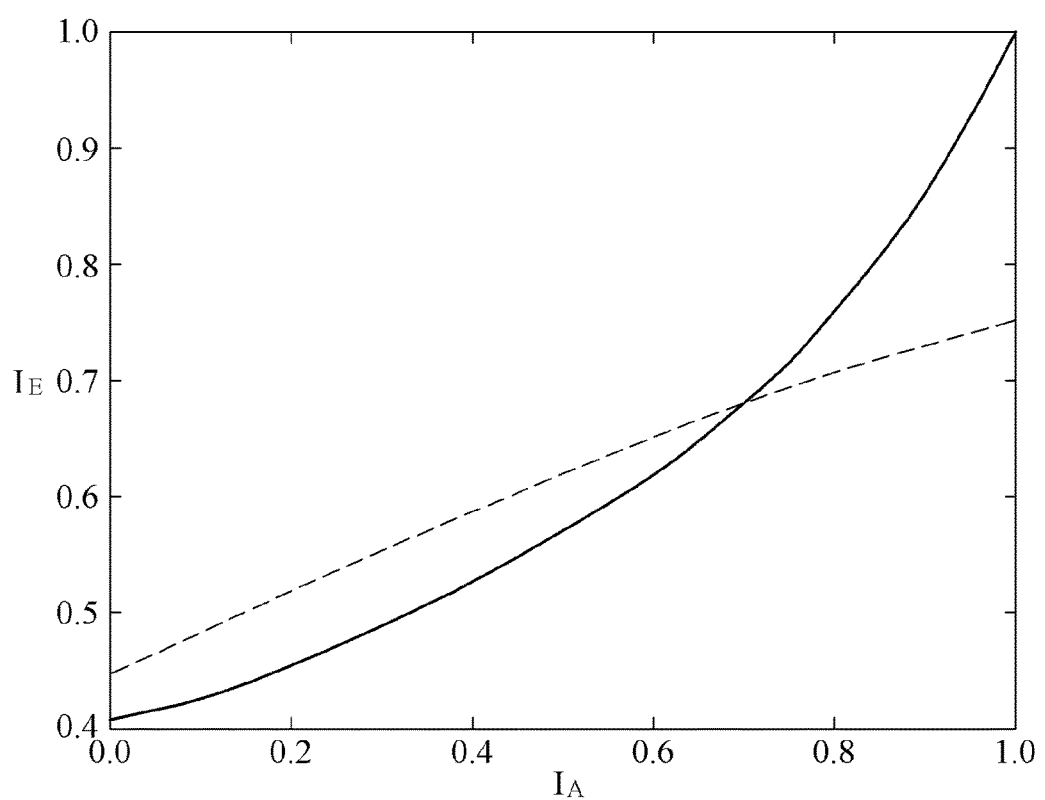
FIG. 11 is a graph illustrating an EXtrinsic Information Transfer (EXIT) chart in the FTN signaling channel environment of FIG. 10.

FIG. 10 is a diagram illustrating a structure for measuring transmission information, for example, mutual information, for an FTN signaling channel environment according to an embodiment. FIG. 11 is a graph illustrating an extrinsic information transfer (EXIT) chart in the FTN signaling channel environment of FIG. 10. FIG. 11 illustrates a result from a general direct detection method and a result from a differential detection method including an iteration process when a signal is received based on the mutual information of FIG. 10. In the EXIT chart of FIG. 11, a vertical axis indicates the mutual information of extrinsic information obtained from an output of a trellis detector in the channel environment illustrated in FIG. 10, and a horizontal axis indicates a priori probability obtained in the channel environment illustrated in FIG. 10. In the EXIT chart of FIG. 11, a broken line indicates the result from the general direct detection, and a solid line indicates the result from the differential detection. As shown in the EXIT chart of FIG. 11, when a priori probability value increases, performance may be improved.

Figure 12:
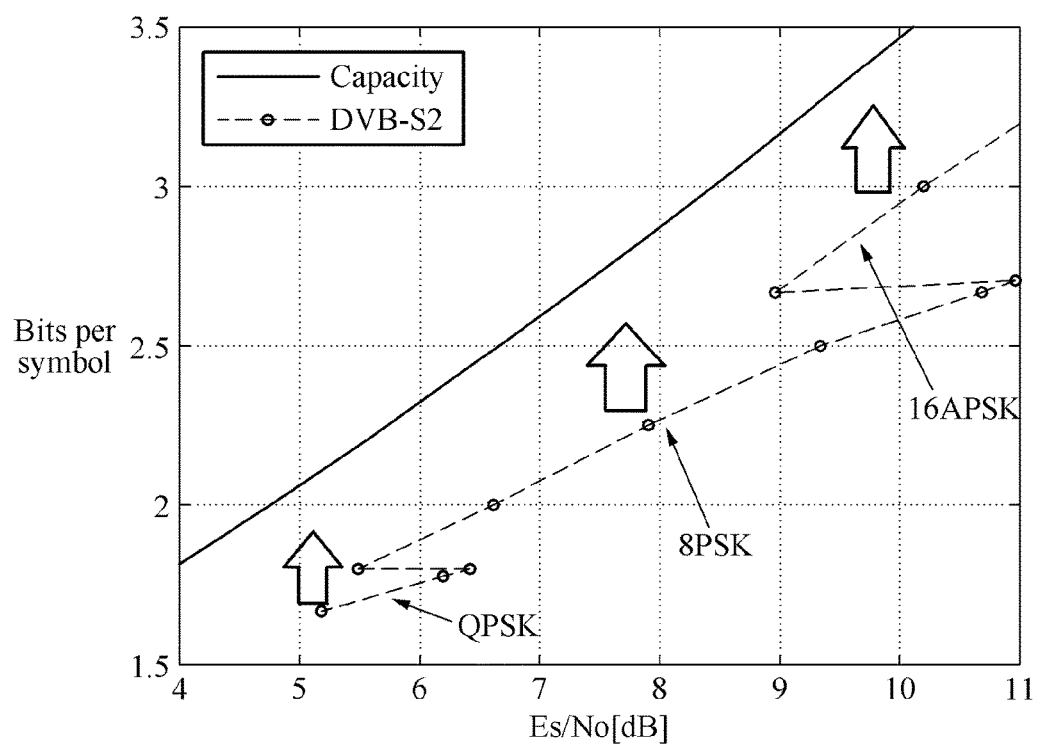
FIG. 12 is a graph illustrating an example of a transmission efficiency in a DVB-S2 standard.

FIG. 12 is a graph illustrating an example of a transmission efficiency in a DVB-S2 standard. In the graph of FIG. 12, a result of comparing a transmission efficiency in the DVB-S2 standard to a Shannon capacity is illustrated. By applying a variable value in Equation 1 by referring to Table 2, a transmission efficiency may be obtained as indicated below, in high-capacity data transmission and reception as in a satellite broadcasting service, for example, a direct to home service. Values indicated in Table 2 are provided as examples of variables for experiments to be conducted by selecting a modulation method and a coding rate that are suitable for the satellite broadcasting service.

TABLE 2

| SE Eq.(1) | DVB-S2 | Time packing-DVB-S2 |
|---|---|---|
| 1.875 | M = 8(8PSK)<br>r = 3/4, α = 0.2 | M = 4(QPSK)<br>r = 3/4, α = 0.2<br>τ = 0.6667 |
| 2.08 | M = 8(8PSK)<br>r = 5/6, α = 0.2 | M = 4(QPSK)<br>r = 3/4, α = 0.2<br>τ = 0.6 |

Referring to the graph of FIG. 12, in the DVB-S2 standard, the transmission efficiency is improved by less than approximately 25%, and thus may be further improved. In theory, high-capacity data such as a satellite broadcasting service may be transmitted within a short period of time using only a bandwidth of a less resource by improving a data transmitting and receiving model in accordance with the DVB-S2 standard. As described above, an efficiency in transmitting and receiving data may be improved.

Figure 13:
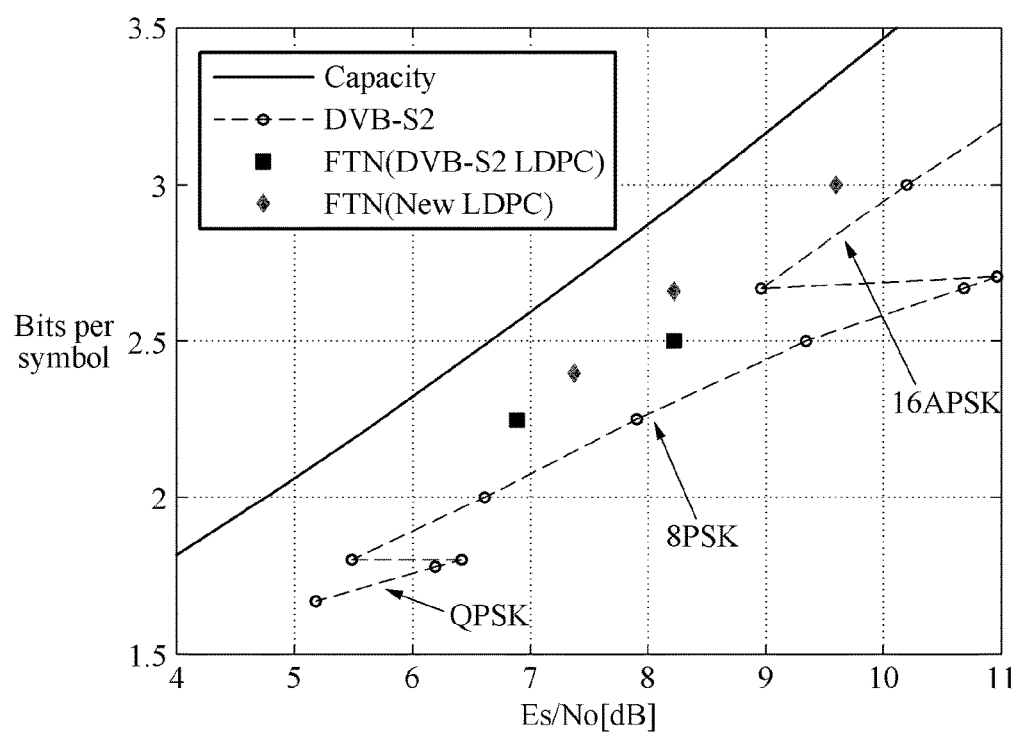
FIG. 13 is a graph illustrating an example of a transmission efficiency according to an embodiment.

FIG. 13 is a graph illustrating an example of a transmission efficiency according to an embodiment. In detail, FIG. 13 illustrates a transmission efficiency when transmitting and receiving data through an FTN method based on a transmission parameter shown in Table 2. Here, a roll-off value is 0.2.

In the graph of FIG. 13, a solid line indicates a data transmission limit point based on a Shannon-Hartley theorem, and a broken line indicates a transmission efficiency when a DVB-S2 standard based data transmitting and receiving apparatus transmits data at a Nyquist rate.

In the graph of FIG. 13, a quadrangular point indicates a data transmission efficiency by the DVB-S2 standard based data transmitting and receiving apparatus including an LDPC encoding process. Also, in the graph of FIG. 13, a diamond-shaped point indicates a data transmission efficiency by a data transmitting and receiving apparatus including an LDPC encoding process and a synchronization process according to example embodiments described herein.

As illustrated in FIG. 13, the data transmitting and receiving apparatus according to the example embodiments described herein has a transmission efficiency closest to the limit point of theoretical data transmission efficiency. In any modulation method, for example, QPSK, 8PSK, and 16APSK, a highest data transmission efficiency may be obtained. In detail, a transmission rate may be improved by approximately 11 to 12% in comparison to a data transmitting and receiving modem illustrated by the solid line.

The units described herein may be implemented using hardware components and software components. For example, the hardware components may include microphones, amplifiers, band-pass filters, audio to digital convertors, non-transitory computer memory and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transistory computer readable recording mediums The non-transitory computer readable recording medium may include any data storage device that can store data which can be thereafter read by a computer system or processing device.

The above-described embodiments of the present disclosure may be recorded in non-transistory computer-readable media including program instructions to implement various operations embodied by a computer. The media may also include, alone or in combination with the program instructions, data files, data structures, and the like. Examples of non-transistory computer-readable media include magnetic media such as hard disks, floppy disks, and magnetic tapes; optical media such as CD ROMs and DVDs; magneto-optical media such as floptical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments of the present disclosure, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A data transmitting apparatus, comprising:
a low-density parity-check (LDPC) encoder configured to perform, on data to be transmitted by a faster-than-Nyquist method (FTN), LDPC encoding using a first matrix having a first degree less than a preset reference degree and a second matrix of a single diagonal matrix;
a symbol mapper configured to perform symbol mapping on information bits and a parity bits of data LDPC encoded, independently, by performing interleaving on the information bits and the parity bits using different interleavers and applying differential encoding to a part of codeword of information and a codeword of the parity bits; and
an accelerator configured to accelerate an output signal from the different interleavers by a transmission rate based on the FTN method,
wherein each degree is a value based on the number of 1's elements of a matrix, and
wherein the preset reference degree is according to degree distribution of each LDPC code rate defined in DVB-S2 standard.

2. The apparatus of claim 1, wherein the degree of the first matrix is one of 1, 2, and 3, and a degree of the second matrix is 1.

3. The apparatus of claim 1,
wherein the symbol mapper is configured to perform the interleaving on the information bits through a first interleaver, and perform the interleaving on the parity bits through a second interleaver having a different degree from the first interleaver, and
wherein the first interleaver is set to be less than or equal to a length of the data, and the second interleaver is set to be greater than or equal to a difference between the length of the data and a length of the LDPC encoded data.

4. The apparatus of claim 3, wherein the differential encoding is applied to the codeword using the second interleaver.

5. The apparatus of claim 3, wherein each of the first interleaver and the second interleaver is based upon a prime number.

6. The apparatus of claim 1,
wherein the symbol mapper is configured to perform first symbol mapping on the information bits, and to perform second symbol mapping on the parity bits independently from the first symbol mapping, and
wherein the second symbol mapping is symbol mapping iteratively performed on the parity bits based on real-axis data and imaginary-axis data.

7. The apparatus of claim 1, wherein the output signal comprises an interference corresponding to the transmission rate.

8. A data receiving apparatus, comprising:
a synchronizer configured to perform carrier synchronization by receiving a signal obtained by performing low-density parity-check (LDPC) encoding using a first matrix having a first degree less than a preset reference degree and a second matrix of a single diagonal matrix, wherein the signal is generated by interleaving information bits and parity bits through two different interleavers and applying differential encoding on a codeword of the parity bits;
a detector configured to detect an original signal by applying a first Bahl, Cocke, Jelinek, and Raviv (BCJR) algorithm to the information bits and applying a second BCJR algorithm comprising differential decoding to the parity bits, compensate for a phase error of the original signal by tracing back a signal from a forward recursor comprised in the first BCJR algorithm and the second BCJR algorithm, and eliminate an inter-symbol interference (ISI) using a faster-than-Nyquist (FTN) method applied to the received signal; and
an LDPC decoder configured to perform LDPC decoding corresponding to the LDPC encoding applied to the received signal using two deinterleavers having different degrees,
wherein each degree is a value based on the number of 1's elements of a matrix, and
wherein the preset reference degree is according to degree distribution of each LDPC code rate defined in DVB-S2 standard.

9. The apparatus of claim 8, wherein the synchronizer comprises:
a frame synchronizer configured to perform fine timing synchronization by estimating a frequency error by discovering a correlation peak point in a time domain and applying a fast Fourier transform (FFT) operation based on the correlation peak point in a frequency domain, and by detecting a timing error based on an approximate maximum likelihood method; and
a signal level controller configured to control a signal level using a robust signal-to-noise ratio (SNR) estimator.

10. The apparatus of claim 9, wherein the signal level controller is configured to control the signal level when a timing error detector (TED) and a timing error controller (TEC) are in a steady state based on a pilot symbol.

11. The apparatus of claim 8, wherein the forward recursor of the detector is configured to perform synchronous detection by temporarily selecting a path in which the received signal and a signal to be transmitted are stochastically similar to each other, and correcting phase noise through a branch metric operation based on the selected path.

12. The apparatus of claim 8, wherein the two deinterleavers correspond to the two interleavers, respectively, applied to the received signal.

* * * * *